(12) United States Patent
Lin et al.

(10) Patent No.: US 8,092,043 B2
(45) Date of Patent: Jan. 10, 2012

(54) LED LAMP TUBE WITH HEAT DISTRIBUTED UNIFORMLY

(75) Inventors: Kuo-Len Lin, Wugu Township, Taipei County (TW); Chen-Hsiang Lin, Wugu Township, Taipei County (TW); Wen-Jung Liu, Wugu Township, Taipei County (TW); Hwai-Ming Wang, Wugu Township, Taipei County (TW); Ken Hsu, Wugu Township, Taipei County (TW); Chih-Hung Cheng, Wugu Township, Taipei County (TW)

(73) Assignees: Cpumate Inc, Taipei (TW); Golden Sun News Techniques Co., Ltd., Taipei (TW)

( * ) Notice: Subject to any disclaimer, the term of this patent is extended or adjusted under 35 U.S.C. 154(b) by 340 days.

(21) Appl. No.: 12/166,552

(22) Filed: Jul. 2, 2008

(65) Prior Publication Data
US 2010/0002424 A1 Jan. 7, 2010

(51) Int. Cl.
*F21S 4/00* (2006.01)
*F21V 21/00* (2006.01)

(52) U.S. Cl. .................. 362/249.02; 362/221; 362/225; 362/800

(58) Field of Classification Search .................. 362/221, 362/225, 249.01, 249.02, 800
See application file for complete search history.

(56) References Cited

U.S. PATENT DOCUMENTS
6,762,562 B2 * 7/2004 Leong .............................. 315/51
* cited by examiner

*Primary Examiner* — Jason Moon Han
(74) *Attorney, Agent, or Firm* — Chun-Ming Shih; HDLS IPR Services

(57) ABSTRACT

A LED lamp tube which includes a hollow transparent tube, a LED lamp assembly disposed in the transparent tube, two conductive caps provided on both ends of the transparent tube respectively, and a circuit control unit. The circuit control unit includes a plurality of separated sub-portions. The respective sub-portions of the circuit control unit are distributed uniformly on the circuit board of the LED lamp assembly. Via the uniform arrangement of respective sub-portions of the circuit control unit, the heat within the LED lamp tube can be distributed uniformly, thereby lowering the temperature and facilitating the heat dissipation.

4 Claims, 4 Drawing Sheets

LED LAMP TUBE WITH HEAT DISTRIBUTED UNIFORMLY

BACKGROUND OF THE INVENTION

1. Field of the Invention

The present invention relates to a lamp tube, and in particular to a LED lamp tube for replacing a fluorescent lamp.

2. Description of Prior Art

As shown in FIG. 1, the conventional LED lamp tube has a glass-made tube 1a and a LED lamp assembly 2a. The LED lamp assembly 2a comprises a circuit board 20a disposed horizontally and transversely in the tube 1a. On the downwardly-facing surface of the circuit board 20a is provided with a plurality LED lamps 21a (i.e. light-emitting diodes), while the upwardly-facing surface is provided with a circuit control unit 22a for converting into currents and voltages suitable for the light-emitting diodes. Further, both ends of the tube 1a are provided with a conductive cap 10a and are electrically connected with the circuit board 20a respectively. Via the above arrangement, a LED lamp tube having a plurality of light-emitting diodes is formed, thereby replacing traditional florescent lamps.

However, with regard to the arrangement of electronic elements in the above-mentioned LED lamp, the circuit control unit 22a is arranged on one side of the circuit board 20a. That is to say, the circuit control unit is concentrated on one end of the tube 1a while the other end is not provided with any other electronic elements. Although such an arrangement facilitates the integration of electronic elements, in practice, the performance of the LED lamp tube and a neighboring LED lamp 21a may be affected because the heat is concentrated on the same side of the circuit board 20a. Even, a portion of the LED lamp 21a may suffer damage prematurely due to poor heat-dissipating effect. As a result, the whole LED lamp tube has to be replaced. Thus, the lifetime of the LED lamp tube is reduced a lot, which also results in the waste of unburned LED lamp 21a.

In view of the above drawbacks, the Inventor proposes the present invention based on his expert knowledge and elaborate researches in order to solve the problems of prior art.

SUMMARY OF THE INVENTION

The present invention is to provide a LED lamp tube with heat distributed uniformly. In view of the heat distribution of each LED lamp in the LED lamp tube, the respective electronic elements electrically connected on the circuit board are arranged uniformly, so that the heat generated by the electronic elements will not concentrate on one side or the same position of the circuit board. Thus, the heat within the LED lamp tube can be distributed uniformly, thereby lowering the temperature and facilitating the heat dissipation.

The present invention is to provide a LED lamp tube with heat distributed uniformly, which includes a hollow transparent tube, a LED lamp assembly disposed in the transparent tube, two conductive caps provided on both ends of the transparent tube respectively, and a circuit control unit. The structure of the circuit control unit is constituted of a plurality of separated sub-portions. The respective sub-portions of the circuit control unit are distributed uniformly on the circuit board of the LED lamp assembly.

DETAILED DESCRIPTION OF THE INVENTION

In order to make the Examiner to better understand the characteristics and technical contents of the present invention, a detailed description relating thereto will be made with reference to the accompanying drawings. However, the drawings are illustrative only, but not used to limit the present invention.

Figure 1:
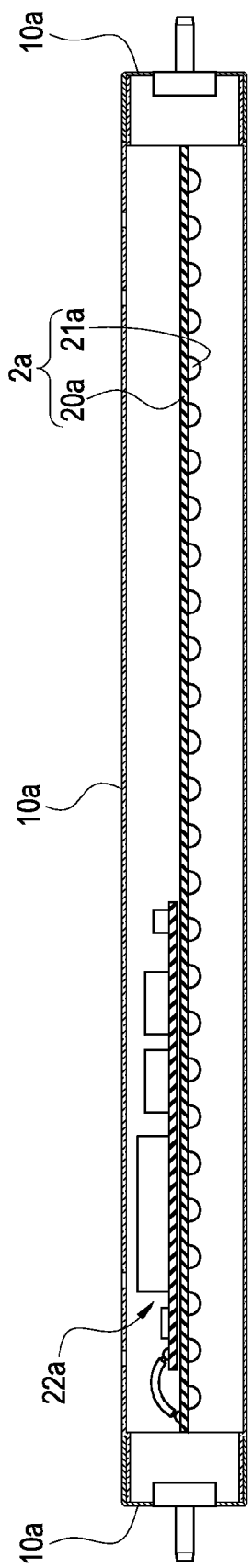
FIG. 1 is a cross-sectional view showing a conventional LED lamp tube.
Figure 2:
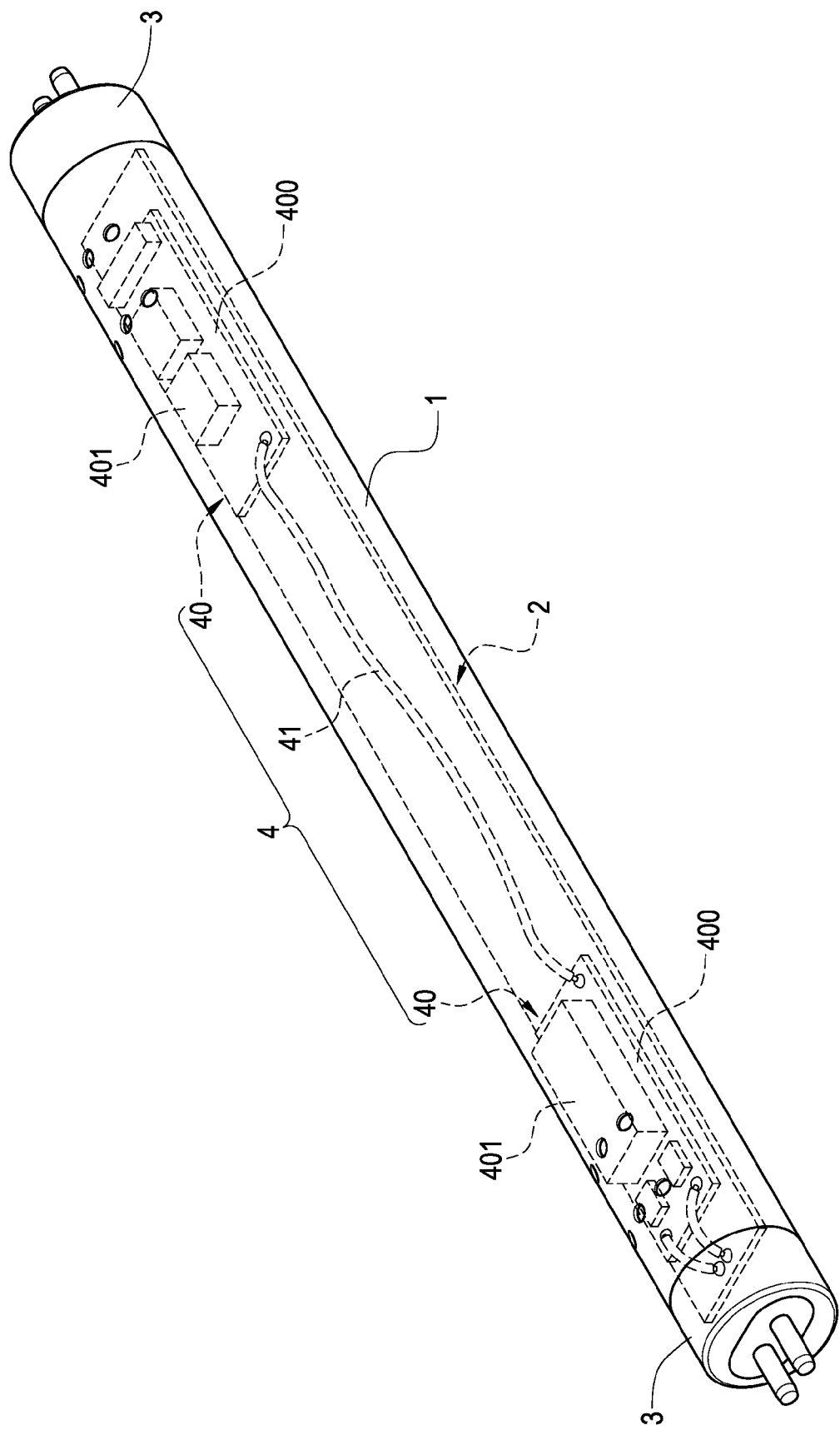
FIG. 2 is a perspective view showing the first embodiment of the present invention.
Figure 3:
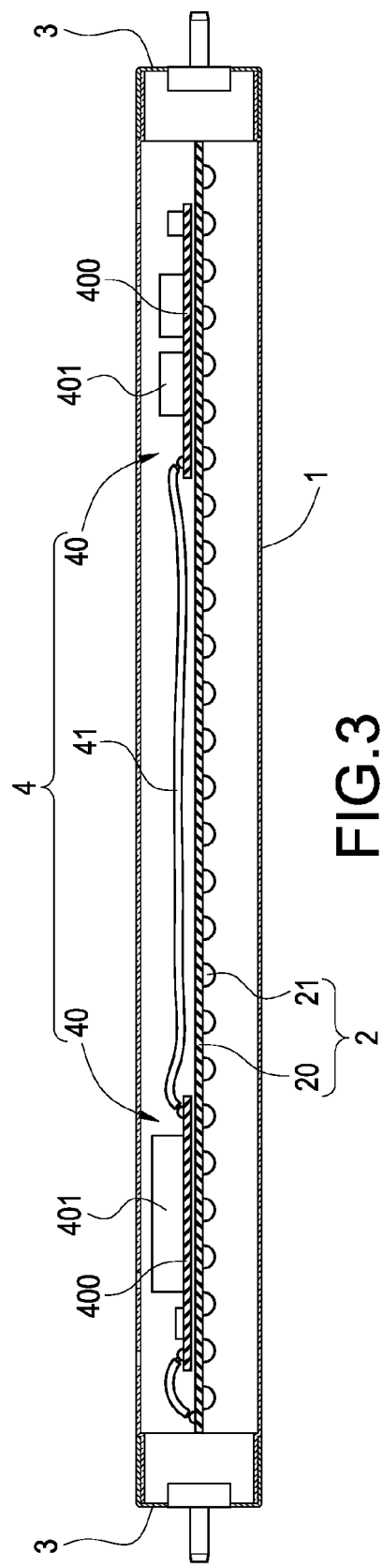
FIG. 3 is a cross-sectional view showing the first embodiment of the present invention.

Please refer to FIGS. 2 and 3, which are a perspective view and a cross-sectional view showing the first embodiment of the present invention respectively. The present invention is to provide a LED lamp tube with heat distributed uniformly, which includes a transparent tube 1, a LED lamp assembly 2, two conductive caps 3, and a circuit control unit 4.

The transparent tube 1 is a hollow elongate tube with two open ends. The transparent tube 1 is made of light-transmitting materials for receiving the LED lamp assembly 2 and the circuit control unit 4.

The LED lamp assembly 2 comprises a circuit board 20 horizontally arranged in the transparent tube 1, and a plurality of LED lamps 21 arranged on the downwardly-facing surface of the circuit board 20, as shown in FIG. 3. The LED lamps 21 are light-emitting diodes that are arranged on the circuit board 20 and are accommodated in the transparent tube 1 together with the circuit board 20. The LED lamps 21 illuminate a side peripheral wall surface of the transparent tube 1.

The two conductive caps 3 are mounted on both open ends of the transparent tube 1 and are electrically connected to the circuit board 20 of the LED lamp assembly 2 respectively, so that the LED lamp assembly 2 can be provided with necessary electricity via the two conductive caps 3.

The primary characteristic of the present invention lies in that the structure of the circuit control unit 4 is constituted of a plurality of separated sub-portions 40. Each of the sub-portions 40 comprises a control circuit 400 and a transforming element 401 provided on the control circuit 400 for converting currents and voltages suitably for each LED lamp 21. Furthermore, the respective sub-portions 40 can be electrically connected with each other via a lead 41, thereby electrically integrating with the circuit board 20 of the LED lamp assembly 2.

The electrical function of the circuit control unit 4 has been achieved by integrating these sub-portions 40, but and its whole structure is separated into a plurality of sub-portions 40. In the present embodiment, the circuit control unit 4 is separated into two sub-portions 40, and these two sub-portions 40 are arranged on two ends of the circuit board 20 of the LED lamp assembly 2 adjacent to the transparent tube 1. Since the sub-portions 40 of the circuit control unit 4 are distributed uniformly on the circuit board 20 of the LED lamp assembly 2. In this way, when the LED lamp tube is in use, the heat generated by the circuit control unit 4 can be still uniformly distributed on the circuit board 20 to dissipate the heat. The heat will not be concentrated on the same side or the same position, so that the LED lamp 21 on this position will not be overheated to suffer damage prematurely. In addition, with the heat distributed uniformly, the temperature within the LED lamp tube can be lowered, thereby facilitating the heat-dissipating effect.

Figure 4:
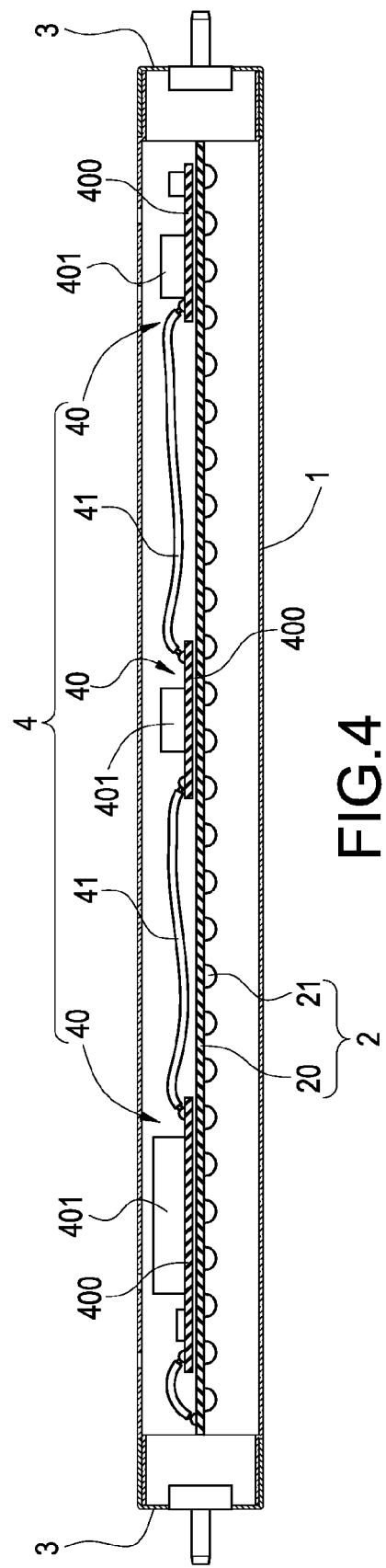
FIG. 4 is a cross-sectional view showing the second embodiment of the present invention.

Furthermore, as shown in FIG. 4, in the second embodiment of the present invention, the circuit board control unit 4 is divided into three sub-portions 40, thereby arranging the circuit control unit 4 more uniformly. Therefore, the number of the sub-portions 40 divided from the circuit control unit 4 is determined based on the number of actual heated points of the LED lamp tube, and thus the number of sub-portions is not limited to two or three.

Therefore, via the above constitution, the LED lamp tube with heat distributed uniformly can be obtained.

According to the above, the present invention really achieves the desired objects and solves the drawbacks of prior art. Further, the present invention indeed has novelty and inventive steps, and thus conforms to the requirements for a utility model patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A LED lamp tube, comprising:
   a transparent tube formed into a hollow elongate tube with both open ends;
   a LED lamp assembly having a flat plane circuit board with an upper surface and a lower surface opposite to the upper surface disposed in the transparent tube and a plurality of LED lamps disposed on the lower surface of the flat plane circuit board;
   two conductive caps provided on both open ends of the transparent tube and electrically connected with the flat plane circuit board of the LED lamp assembly respectively; and
   a circuit control unit electrically connected on the flat plane circuit board of the LED lamp assembly;
   wherein the circuit control unit includes a plurality of separated sub-portions distributed uniformly on the flat plane circuit board and between two ends of the flat plane circuit board, each sub-portion having a flat plane control circuit board disposed on the upper surface of the flat plane circuit board and in parallel with respect to the flat plane circuit board, and a lead electrically connected between two adjacent sub-portions so that the circuit control unit is electrically integrated with the flat plane circuit board,
   thereby when the LED lamp tube is in use, although the circuit control unit generates heat, the heat can be uniformly distributed on the flat plane circuit board to dissipate the heat and the heat will not be concentrated on same side or same position of the flat plane circuit board, so that the LED lamp will not be overheated to suffer damage prematurely and with the heat distributed uniformly, temperature within the LED lamp tube is lowered, thus facilitating heat-dissipating effect.

2. The LED lamp tube according to claim 1, wherein the sub-portion further comprises transforming element provided on the flat plane control circuit board.

3. The LED lamp tube with heat distributed uniformly according to claim 2, wherein two respective sub-portions of the circuit control unit are electrically connected with each other via a lead.

4. The LED lamp tube with heat distributed uniformly according to claim 2, wherein the sub-portion is electrically connected to the flat plane circuit board of the LED lamp assembly, so that the sub-portions are electrically integrated via the flat plane circuit board.

* * * * *